United States Patent [19]

Lundberg

[11] 4,142,113
[45] Feb. 27, 1979

[54] CURRENT PULSE CIRCUIT FOR FERRITE CORE MEMORIES

[75] Inventor: Nils E. B. Lundberg, Enskede, Sweden

[73] Assignee: Telefonaktiebolaget L M Ericsson, Stockholm, Sweden

[21] Appl. No.: 778,225

[22] Filed: Mar. 16, 1977

[30] Foreign Application Priority Data

Apr. 5, 1976 [SE] Sweden .............................. 7603992

[51] Int. Cl.² ............................................ H03K 1/00
[52] U.S. Cl. .................................. 307/270; 307/297; 307/314
[58] Field of Search ............... 307/296, 297, 270, 314, 307/88 R; 323/9; 340/173 R, 174 TB

[56] References Cited

U.S. PATENT DOCUMENTS

| 3,600,667 | 8/1971 | Wynn | 307/297 |
| 3,675,114 | 7/1972 | Nercessian | 307/297 |

FOREIGN PATENT DOCUMENTS 1379591  4/1972  United Kingdom ..................... 307/270

Primary Examiner—Stanley D. Miller, Jr.
Assistant Examiner—B. P. Davis
Attorney, Agent, or Firm—Hane, Roberts, Spiecens & Cohen

[57] ABSTRACT

Current pulse circuit for the supply of a well-defined current pulse to a ferrite core memory of the type where a desired current loop is set up by means of current gates according to a coordinate system. In order to reduce power loss and activation time the circuit is provided with a current regulator comprising a number of parallel-connected output transistors connected as emitter-followers. Base current is supplied to the output transistors by a driver circuit which is controlled by a control voltage received from a comparator circuit in correspondence with the difference between the momentary value of the pulse current and a target value produced by a reference source. The circuit may be further improved by the inclusion of an auxiliary current circuit in parallel with the output transistors, dimensioned to supply an auxiliary current which is equal to or less than the target value.

3 Claims, 6 Drawing Figures

CURRENT PULSE CIRCUIT FOR FERRITE CORE MEMORIES

BACKGROUND OF THE INVENTION

The present invention relates to a current pulse circuit for the supply of a well-defined current pulse to a ferrite core memory of the type where a desired current loop is set up by means of current gates according to a coordinate system.

The current pulses which are used for writing and reading in ferrite core memories must be well defined with respect to rise time, amplitude and duration. From the effectivity point of view it is desirable that the current increases as rapidly as possible until the intended pulse amplitude is obtained after which the current is to be kept constant for a time which is determined by the time required for the remagnetization of the ferrite cores.

In the simplest case the current pulse circuit can be a resistor connected between a direct current source and the current loop being set up. Then the rise time is determined by the quotient between the resistance value and the inductance of the current loop while the pulse amplitude is determined by the quotient between the voltage value of the current source and the resistance. The disadvantage of this arrangement is that the voltage has to be relatively high in order to produce a well-defined pulse amplitude and this causes a high power loss. Besides, the linearity becomes bad since the current grows asymptotically according to an exponential function.

A better current pulse circuit is obtained by substituting an active current regulator for the above-mentioned resistor. The regulator can be controlled from a comparator supplied with a measured voltage which is proportional to the instantaneous magnitude of the current pulse as well as with a reference voltage representing the target value for the pulse amplitude. According to a known embodiment the current regulator comprises a number of parallel-connected output transistors, the number of which depends on the load, whereby the inductive current loop represents the collector load and the measured voltage is obtained across an emitter resistor. In this arrangement the rise time of the current pulse is mainly determined by the growth of the base potential towards a value which is determined by the dimensioning of the regulator, and therefore the linearity becomes very good. The condition, however, for the current regulation to work correctly is that the operating point of the collector is in the active area all the time, i.e. the collector-base voltage must be of such a magnitude that a sufficient current amplification is maintained. Consequently, the input voltage must be dimensioned with regard to the sum of the required collector-base voltage and the counter voltage being induced in the current loop by the current pulse. However, after the current pulse has reached its full amplitude the entire input voltage will load the regulator because the counter voltage has then disappeared. A further condition is that base current must not be supplied to the output transistors before the current loop has been set up, as, otherwise, the base region would be saturated with charge carriers and, consequently, the regulation would be eliminated. Therefore the current regulator has to be activated after the desired current loop has been set up and be deactivated before the current loop is disconnected. Thus the disadvantages of the known arrangement are (1) that it is expensive because it requires a relatively high input voltage, which results in a high power loss in the current regulator, and that (2) it has to be activated after the desired current loop has been set up, which results in a certain time delay and consequently restrains the reading and writing speed of the memory.

SUMMARY OF THE INVENTION

An object of the invention is to provide a regulator which has a low power loss and a short activation time. The characteristics of the invention appear from the claims.

BRIEF DESCRIPTION OF THE DRAWINGS

The invention is described below by means of an embodiment with reference to the appended drawing, where.

Figure 1:
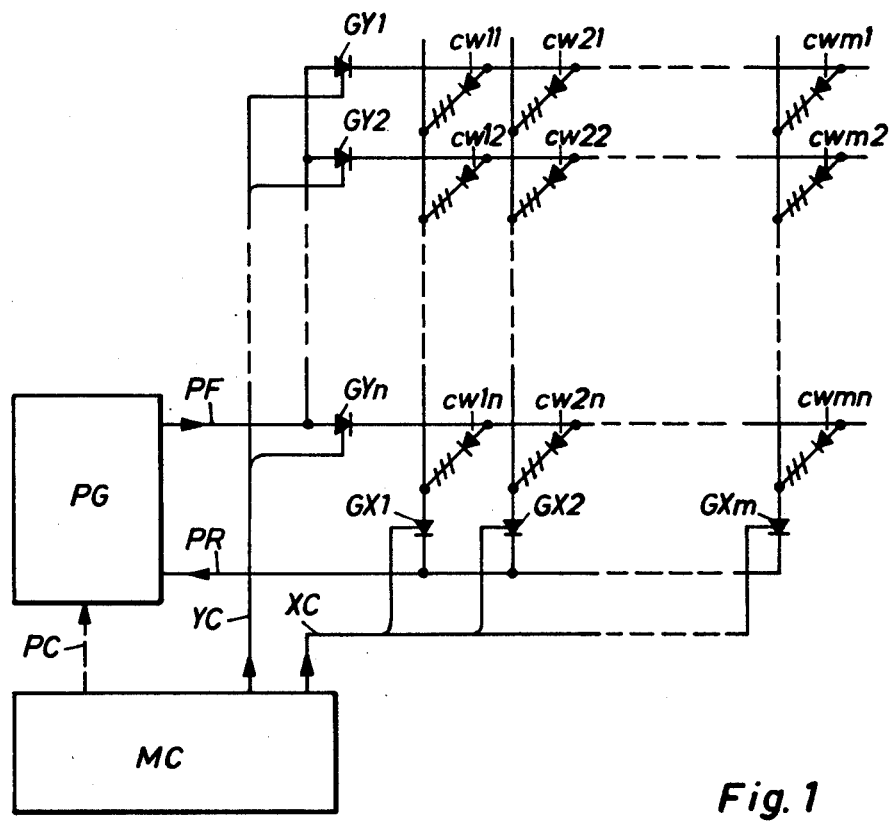
FIG. 1 is a simplified schematic diagram of a ferrite core memory with associated control unit and current pulse circuit.

The arrangement in FIG. 1 contains a ferrite core memory comprising m.n cross points which are formed of m vertical and n horizontal conductors. In each cross point the vertical conductor is connected with the horizontal one via a so called coordinate lead, for example lead CW 11, containing a diode which permits current to pass only in the direction from the horizontal conductor to the vertical conductor. The coordinate lead constitutes the coil of a number of ferrite cores, three in each cross point, according to the embodiment. In series with each of the vertical and the horizontal conductors, respectively, there is a current gate, GX 1–GX m and GY 1–GY n, which can be opened and closed by means of individual control signals on the leads XC and YC from a control unit MC. Furthermore the arrangement contains a current pulse circuit PG having an output PF connected to the current gates GY 1–GY n and a return lead PR connected to the current gates GX 1–GX m. In the Figure, also a connection PC between the control unit MC and the current pulse circuit PG has been marked with a dashed line, this connection being necessary for the control of the current pulse circuit, when provided with a current regulator of the known type. When a write or read operation is to be made in a certain position of the ferrite core memory, the control unit MC emits control signals on the leads XC and YC to open the corresponding current gates for example gates GX m and GY 2. Then a current loop is established from the current pulse circuit PG via the lead PF, the current gate GY 2, the coordinate lead CW m2, the current gate GX m, the lead PR back to the current pulse circuit PG to pass a current pulse. This starts, depending on the design of the current pulse circuit, either immediately when the current loop is established and lasts as long as the current loop remains, or starts first as a result of an activating signal to the control input PC, whereby the current pulse lasts as long as the activation signal and the current loop are maintained. First the two current pulse circuits of the known types mentioned above and then the current pulse circuit according to the invention are described below.

Figure 2:
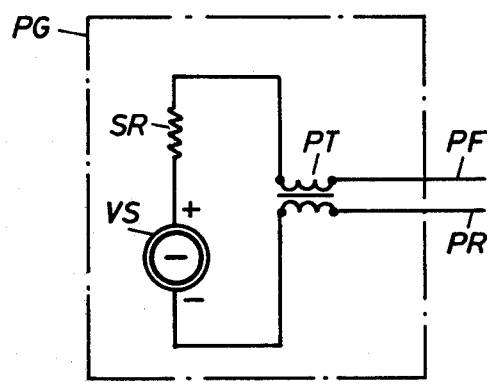
FIG. 2 is a schematic diagram of a simple current pulse circuit without regulator.

FIG. 2 shows a simple current pulse circuit consisting of a direct-current voltage source VS and a resistor SR which are connected in series to the leads PF and PR via a differential transformer PT. The voltage and the resistance are so chosen, considering the impedances and the potential drops being developed in the ferrite core memory between the leads PF and PR, that the current pulse then being emitted has the correct time constant and amplitude.

Figure 3:
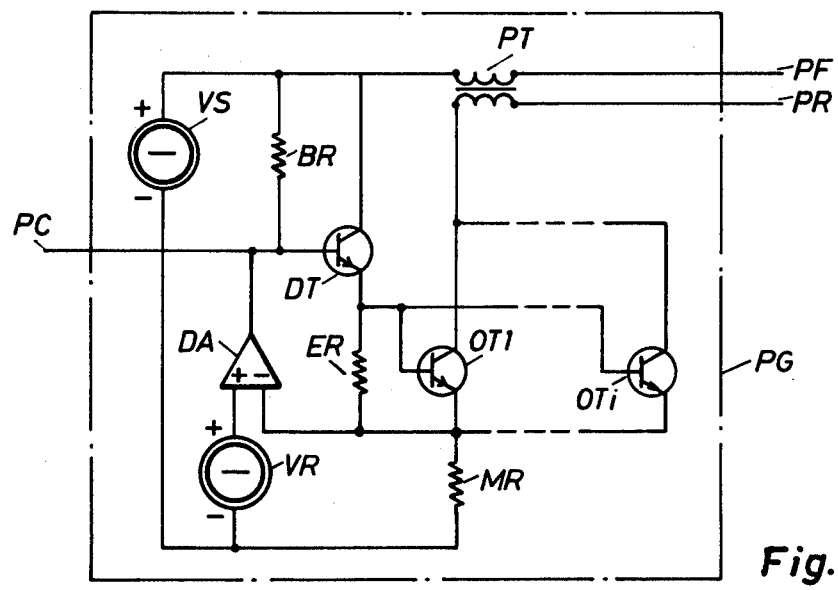
FIG. 3 is a schematic diagram of a regulator of a known type.

Besides a direct current voltage source VS and a differential transformer PT the current pulse circuit according to FIG. 3 contains an active current regulator as a replacement for the resistor SR in the previous figure. The regulator comprises a differential amplifier DA, a reference voltage source VR, a driver amplifier consisting of a transistor DT with a base resistor BR and an emitter resistor ER, a number of parallel-connected output transistors OT 1–OT i and a measuring resistor MR. The differential amplifier DA compares the voltage from the reference voltage source VR with the instantaneous voltage drop across the measuring resistor MR and tries to regulate the base current to the transistor DT so that the voltage drop is affected in the desired direction. The voltage drop across the resistor MR, which is in series with the output transistors, is proportional to the instantaneous value of the emitted current pulse. When at rest, that is before any current loop has been set up between the leads PF, PR, the voltage drop across the measuring resistor is zero. The differential amplifier DA responds to this condition by permitting maximum base current to be fed to the transistor DT via the base resistor BR. If this is effected a maximum current will also be fed to the emitter resistor ER and the base electrodes of the transistors OT 1–i and their base regions will be filled with charge carriers. Such a condition is unacceptable as the current pulse would have quite an uncontrolled growth if the current pulse circuit was simply connected to a current loop. Therefore the regulator is provided with a control input PC to the base electrode of the transistor DT by means of which the regulator can be activated or deactivated. Originally the control input is kept at a low potential so that the transistor DT remains cut off independently of the acting of the differential amplifier. Only when the desired current loop has been set up between the leads PF and PR is the regulator activated by removing the low potential from the input PC and the output current grows at a rate mainly determined by the circuit parameters of the regulator. When the voltage drop across the resistor MR has reached the voltage of the reference voltage source VR the differential amplifier DA reacts and reduces the base current to the transistor DT so much that the voltage drop remains constant. When the current pulse is to be cut off this is best done in such a way that, at first, the regulator is deactivated by means of a low potential on the control input PC and then the current loop is disconnected.

Figure 4:
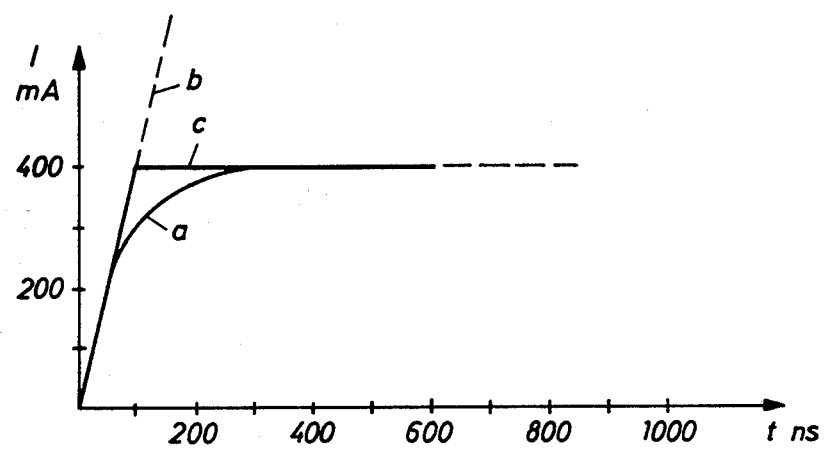
FIG. 4 is a diagram showing the growth of the current pulse in devices according to the two previous figures.

In FIG. 4 the pulse current as a function of time is shown for the first part of the current pulse of the circuits according to FIGS. 2 and 3. According to these designs the target value of the pulse amplitude is 400 mA and the growth rate is $4 \cdot 10^6$ A/s. The curve a of the diagram refers to the current pulse circuit according to FIG. 2. The initial derivative of this curve corresponds to the inclination of the dashed line b and decreases continously to zero as the curve exponentially approaches its final amplitude. It appears from the curve that already small variations of the direct current voltage from the voltage source VS can result in big differencies of the time required for the pulse current to reach that level when the ferrite cores of the memory react. Curve c refers to the circuit according to FIG. 3. This curve can be said to be ideal and it preserves its appearance independently of normal voltage fluctuations.

Figure 5:
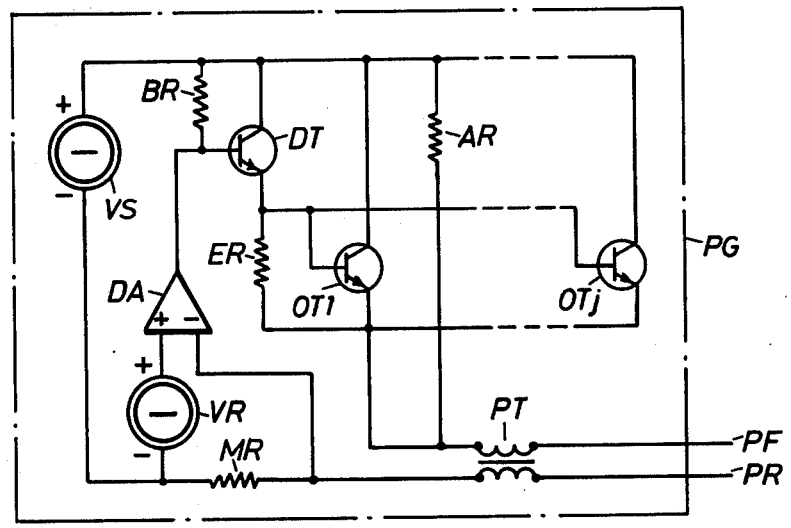
FIG. 5 is a schematic diagram of a current pulse circuit according to the invention.
Figure 6:
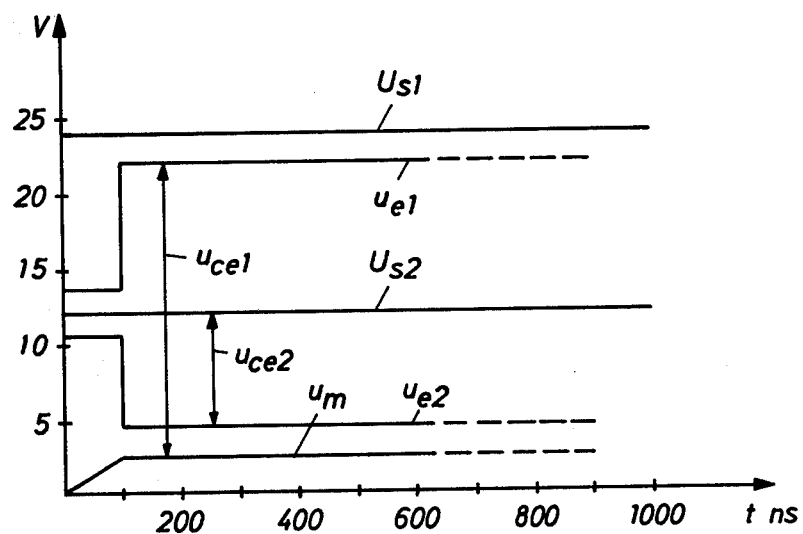
FIG. 6 is a voltage diagram of the two current pulse circuits according to the FIGS. 3 and 5.

FIG. 5 shows how a current pulse circuit can be constructed according to the invention. At a quick look it has great similarities to the arrangement according to FIG. 3 but nevertheless it possesses important differences. Consequently, the circuit contains a direct current voltage source VS, a differential transformer PT and an active current regulator comprising a differential amplifier DA, a reference voltage source VR, a driver amplifier consisting of a transistor DT with a base resistor BR and an emitter resistor ER, a number of parallel-connected output transistors OT 1–OT j and a measuring resistor MR. (Furthermore an auxiliary resistor AR is included whose function will be described below). The important difference between the two circuits according to FIGS. 3 and 5 is the design of the respective current regulators. In the former case the differential transformer is connected to the collector circuits of the output transistors but in the latter case it is connected to the emitter circuits. As it appears from FIG. 5 no current can flow through the measuring resistor MR as long as no current path has been set up between the leads PF and PR. And neither can the transistors DT and OT 1–j receive any base current although the differential amplifier DA regulates maximally in order to obtain the stipulated voltage drop across the measuring resistor. Therefore it is not necessary to have an input corresponding to the control input PC in FIG. 3 but the current pulse can be permitted to start as soon as the desired current loop has been set up which means a gain of time. Another difference between the two circuits is their different dependence on the counter voltage which arises in the inductive load. This is illustrated in FIG. 6 which is a time-voltage diagram for the two circuits where the time t=0 refers to the moment when the current growth begins. The curve $u_m$ describes the current growth across the measuring resistor MR of both current regulation circuits. As to the other curves of the diagram, those having index 1 refer to the regulator according to FIG. 3 and those having index 2 refer to the regulator according to FIG. 5. Thus $U_{s1}$, $U_{s2}$ designate the supply voltages from the respective direct current voltage sources VS, $u_{c1}$ designates the collector voltage of the output transistors OT 1–i, $u_{e2}$ designates the emitter voltage of the output transistors OT 1–j and $u_{ce1}$, $u_{ce2}$ designate the voltage differences between the collectors and the emitters of the output transistors. According to the Figure, the voltage $U_{s1}$ is 24 V and the voltage $U_{s2}$ is 12 V. The reference voltage from the voltage source VR is assumed to be 2.5 V. The growth rate of the current pulse is supposed to be equal for both circuits and it is assumed to have the shape described by curve c of FIG. 4. This causes a voltage drop $u_m$ across the measuring resistor MR which grows with the current until it reaches the reference value 2.5 V. The current also brings about a voltage drop across the load between the leads $P_F$, $P_R$ which, during the current growth, is dominated by the induced counter voltage.

As the current derivative is assumed to be constant also the counter voltage becomes constant and according to the Figure it amounts to 8.5 V. Additional voltage drops arise in the semiconductor elements which are included in the current loop, that is the current gates and the series diode of the coordinate lead. These voltage drops are mainly independent of the magnitude of the current and are assumed to amount to 2.0 V during the whole of the current pulse.

In the regulator according to FIG. 3 the collector voltage $u_{c1}$ will remain at 13.5 V during the growth of the current pulse while the emitter voltage $u_m$ grows from 0 to 2.5 V. Consequently the collector-emitter voltage $u_{ce1} = 10.5$ V at the end of the growth time which is the required magnitude to make the regulator according to FIG. 3 work efficiently. The regulation begins when the measuring voltage $u_m$ has reached 2.5 V, whereby the current derivative falls rapidly towards zero and the induced counter voltage disappears. The voltage across the output transistors then rises to 19.5 V and gives rise to a considerable power dissipation.

Under the same conditions as above, the emitter voltage $u_{e2}$ of the regulator according to FIG. 5 should lie 10.5 V above the measuring voltage $u_m$ during the growth time of the current pulse. This is also the case at the beginning of the pulse, but, owing to the limited operating margin available to the transistors, the emitter voltage cannot be higher than about 10.5 V and therefore the voltage across the load will gradually sink to 8 V while the measuring voltage rises to 2.5 V. Owing to this declining voltage drop across the load the current growth will not be absolutely linear but the deviation is so small that it does not affect the growth time noticeably. Therefore the assumption originally made can be considered as valid with a sufficiently good approximation. It should be noted that the limited operating margin of the transistors has no influence on the ability of the regulator to start operating when the measuring voltage has reached the reference voltage 2.5 V, owing to the emitter-follower principle applied to the output transistors. When, finally, the pulse current has reached its final value the collector-emitter voltage $u_{ce2}$ rises to 7.5 V which gives a considerably lower power loss than in the former case.

In FIG. 5 a resistor AR also is drawn in parallel with the output transistors. The purpose of this resistor is to produce an auxilary current which, to a large extent, relieves the output transistors OT 1-j of the load upon reaching the full pulse amplitude. Regarding the tolerances of the direct-current voltage source VS a certain margin must be left for the regulation and hence the resistor AR can be dimensioned to take care of, for example, nominally 360 mA of the load current whereas the regulator handles the remaining 40 mA. In that way the power dissipation of the output transistors is reduced during this phase to 10% of the total loss. During the growth time of the pulse, however, the voltage across the resistor AR is only about 1.5 V and so the current through the resistor is only about 70 mA. Therefore, at the end of the growth time the current through the output transistors will be about 330 mA but on the other hand the voltage $u_{ce2}$ is low and therefore the power loss during this phase is negligible.

We claim:

1. Current pulse generating apparatus comprising: a differential transformer having first and second windings, one end of each winding being adapted to be connected to a load; a current source having first and second terminals; a plurality of transistor means, each of said transistor means having collector-, base- and emitter-terminals; means for connecting all of said collector terminals in parallel to one of the terminals of said current source; means for connecting all of said emitter terminals to the other end of one of said windings; driver circuit means having an output connected to all of said base terminals in parallel and a control input; control means responsive to current flow through one of said windings, and connected to the other end of the other winding for controlling the operation of said driver means; and means for connecting the other terminal of said current source to said other end of said other winding.

2. The apparatus of claim 1 further comprising a resistor means connected in parallel with said plurality of transistor means.

3. The apparatus of claim 1 wherein said control means comprises a resistor connected between said other end of said other winding and said other terminal of said current source, a source of a reference voltage, a differential amplifier means having a first input responsive to said source of reference voltage, a second input responsive to the voltage developed across resistors and an output connected to the control input of said driver circuit means.

* * * * *